(12) United States Patent
Shives et al.

(10) Patent No.: US 9,253,924 B2
(45) Date of Patent: *Feb. 2, 2016

(54) OPTIMIZED FRAME SYSTEM FOR A DISPLAY DEVICE

(71) Applicant: GrafTech International Holdings Inc., Independence, OH (US)

(72) Inventors: Gary D. Shives, Brunswick, OH (US); Gerald Hoffert, Euclid, OH (US); William Varela, Oceanside, CA (US)

(73) Assignee: GrafTech International Holdings Inc., Independence, OH (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/793,903

(22) Filed: Jul. 8, 2015

(65) Prior Publication Data

US 2015/0313038 A1 Oct. 29, 2015

Related U.S. Application Data

(63) Continuation of application No. 11/167,935, filed on Jun. 27, 2005, now Pat. No. 9,081,220.

(51) Int. Cl.
*G02F 1/1333* (2006.01)
*H05K 7/20* (2006.01)
*H05K 5/00* (2006.01)

(52) U.S. Cl.
CPC ............ *H05K 7/2039* (2013.01); *H05K 5/0017* (2013.01)

(58) Field of Classification Search
CPC .......................................... G02F 2001/133628
See application file for complete search history.

(56) References Cited

U.S. PATENT DOCUMENTS

| | | | |
|---|---|---|---|
| 1,137,373 | A | 4/1915 | Alysworth |
| 3,404,061 | A | 10/1968 | Shane et al. |
| 3,492,197 | A | 1/1970 | Olstowski et al. |
| 3,981,427 | A | 9/1976 | Brookes |
| 4,355,684 | A | 10/1982 | Caines |
| 4,895,713 | A | 1/1990 | Greinke et al. |
| 4,914,551 | A | 4/1990 | Anschel et al. |
| 5,100,737 | A | 3/1992 | Colombier et al. |
| 5,128,209 | A | 7/1992 | Sakai et al. |

(Continued)

FOREIGN PATENT DOCUMENTS

| | | |
|---|---|---|
| EP | 1 530 413 A | 5/2005 |
| JP | 10-56114 A | 2/1998 |

(Continued)

*Primary Examiner* — Timothy L Rude
(74) *Attorney, Agent, or Firm* — Buchanan, Ingersoll & Rooney PC

(57) ABSTRACT

An image display device comprising an image display panel, heat dispersion material positioned proximate to the image display panel, a frame system including a framework positioned proximate to the heat dispersion material opposite the image display panel, and a plurality of electronic components engaging the framework, where the image display device exhibits a support factor of less than about 150 mm-W/m° K. The framework can be adhesively bonded to the heat dispersion material. The framework can include a height and a width wherein the heat dispersion material substantially spans the height and the width. Additionally, a first cross support can span the framework and a plurality of second electronic components can engage the first cross support. Additionally a second cross support can span the framework wherein at least one of the second electronic components engages the second cross support.

16 Claims, 11 Drawing Sheets

(56) References Cited

U.S. PATENT DOCUMENTS

| | | |
|---|---|---|
| 5,482,520 A | 1/1996 | Alam et al. |
| 5,499,120 A | 3/1996 | Hansen |
| 5,644,327 A | 7/1997 | Onyskevych et al. |
| 5,773,113 A | 6/1998 | Akhter |
| 5,831,374 A | 11/1998 | Morita et al. |
| 5,869,919 A | 2/1999 | Sato et al. |
| 5,902,762 A | 5/1999 | Mercuri et al. |
| 6,060,166 A | 5/2000 | Hoover et al. |
| 6,075,701 A | 6/2000 | Ali et al. |
| 6,128,209 A | 10/2000 | Kuroki |
| 6,131,651 A | 10/2000 | Richey, III |
| 6,245,400 B1 | 6/2001 | Tzeng et al. |
| 6,407,922 B1 | 6/2002 | Eckblad et al. |
| 6,409,562 B1 | 6/2002 | Asano et al. |
| 6,432,497 B2 | 8/2002 | Bunyan |
| 6,482,520 B1 | 11/2002 | Tzeng |
| 6,503,626 B1 | 1/2003 | Norley et al. |
| 6,538,892 B2 | 3/2003 | Smale |
| 6,621,482 B2 | 9/2003 | Fuller |
| 6,737,790 B2 | 5/2004 | Seki |
| 6,758,263 B2 | 7/2004 | Krassowski et al. |
| 6,777,086 B2 | 8/2004 | Norley et al. |
| 6,835,453 B2 | 12/2004 | Greenwood et al. |
| 6,856,076 B2 | 2/2005 | Kim et al. |
| 6,917,408 B2 | 7/2005 | Nishino |
| 6,930,737 B2 | 8/2005 | Weindorf et al. |
| 7,138,029 B2 | 11/2006 | Norley et al. |
| 7,150,914 B2 | 12/2006 | Clovesko et al. |
| 7,160,619 B2 | 1/2007 | Clovesko et al. |
| 7,254,031 B2 | 8/2007 | Kim et al. |
| 7,276,273 B2 | 10/2007 | Clovesko et al. |
| 7,303,820 B2 | 12/2007 | Capp et al. |
| 7,306,847 B2 | 12/2007 | Capp et al. |
| 7,385,819 B1 | 6/2008 | Shives et al. |
| 7,658,999 B2 | 2/2010 | Clovesko et al. |
| 7,666,270 B1 | 2/2010 | Smale et al. |
| 2002/0140880 A1 | 10/2002 | Weindorf et al. |
| 2002/0157818 A1 | 10/2002 | Norley et al. |
| 2002/0163076 A1 | 11/2002 | Tzeng et al. |
| 2002/0166658 A1 | 11/2002 | Norley et al. |
| 2004/0257307 A1 | 12/2004 | Bae et al. |
| 2004/0257494 A1 | 12/2004 | Park |
| 2005/0046618 A1 | 3/2005 | Kim et al. |
| 2005/0062382 A1 | 3/2005 | Kim et al. |
| 2005/0067963 A1 | 3/2005 | Kim |
| 2005/0068738 A1 | 3/2005 | Kim et al. |
| 2005/0077000 A1 | 4/2005 | Norley et al. |
| 2005/0088097 A1 | 4/2005 | Bae et al. |
| 2005/0122019 A1 | 6/2005 | Bae |
| 2005/0174054 A1 | 8/2005 | Kang et al. |
| 2005/0194900 A1 | 9/2005 | Kim et al. |
| 2005/0236948 A1 | 10/2005 | Hayashi et al. |
| 2006/0103774 A1 | 5/2006 | Han et al. |
| 2010/0009174 A1* | 1/2010 | Reis ............................. 428/332 |

FOREIGN PATENT DOCUMENTS

| | | |
|---|---|---|
| JP | 11-58591 A | 3/1999 |
| JP | 11-179830 A | 7/1999 |
| JP | 2003-168882 A | 6/2003 |
| KR | 10-2001-0110652 | 12/2001 |
| KR | 10-2005-0019232 | 3/2005 |
| KR | 10-0521475 B1 | 10/2005 |
| WO | WO 02/096615 A1 | 12/2002 |
| WO | WO 03/051772 A1 | 6/2003 |

\* cited by examiner

OPTIMIZED FRAME SYSTEM FOR A DISPLAY DEVICE

RELATED APPLICATION

This application is a continuation of U.S. patent application having Ser. No. 11/167,935, entitled "Optimized frame system for a display device," filed in the names of Shives et al. on Jun. 27, 2005, the disclosure of which is incorporated herein by reference.

TECHNICAL FIELD

The present invention relates to an optimized frame system used in conjunction with a heat spreader in a display device, such as a plasma display panel (PDP), a liquid crystal display (LCD), and the like, and the design and use of the frame system in view of the unique thermal issues occasioned by these devices.

BACKGROUND OF THE ART

A plasma display panel is a display apparatus which contains a plurality of discharge cells, and is constructed to display an image by applying a voltage across electrodes discharge cells thereby causing the desired discharge cell to emit light. A panel unit, which is the main part of the plasma display panel, is fabricated by bonding two glass base plates together in such a manner as to sandwich a plurality of discharge cells between them.

In a plasma display panel, each of the discharge cells which are caused to emit light for image formation generate heat and each thus constitutes a source of heat, which causes the temperature of the plasma display panel as a whole to rise. The heat generated in the discharge cells is transferred to the glass forming the base plates, but heat conduction in directions parallel to the panel face is difficult because of the poor thermal spreading properties of the glass base plate material.

In addition, the temperature of a discharge cell which has been activated for light emission rises markedly, while the temperature of a discharge cell which has not been activated does not rise as much. Because of this, the panel face temperature of the plasma display panel rises locally in the areas where an image is being generated. Moreover, a discharge cell activated in the white or lighter color spectra generate more heat than those activated in the darker color spectra. Thus, the temperature of the panel face differs locally depending on the colors generated in creating the image. These localized temperature differentials can accelerate thermal deterioration of affected discharge cells, unless measures are taken to ameliorate the differences, and are often referred to as "burn-in" or "image-sticking," depending upon their level of permanency. Additionally, when the nature of the image on the display changes, the location for localized heat generation changes with the image.

Further, since the temperature difference between activated and nonactivated discharge cells can be high, and the temperature difference between discharge cells generating white light and those generating darker colors can also be high, a stress is applied to the panel unit, causing the conventional plasma display panel to be prone to cracks and breakage.

When the voltage to be applied to the electrodes of discharge cells is increased, the brightness of the discharge cells increases but the amount of heat generation in such cells also increases. Thus, those cells having large voltages for activation become more susceptible to thermal deterioration and tend to exacerbate the breakage problem of the panel unit of the plasma display panel. The backlights for LCD displays, such as LED's (light emitting diodes) and CCFL's (cold cathode fluorescent light or lamp), present similar issues with respect to heat generation as do emissive displays, such as PDP's.

The use of so-called "high orientation graphite film" as thermal interface materials for plasma display panels to fill the space between the back of the panel and a heat sinking unit to even out local temperature differences is suggested by Morita, Ichiyanagi, Ikeda, Nishiki, Inoue, Komyoji and Kawashima in U.S. Pat. No. 5,831,374. However, the disclosure appears to be centered on the use of pyrolytic graphite as the graphitic material and makes no mention of the use or distinct advantages of sheets of compressed particles of exfoliated graphite. In addition, the use of a heavy aluminum heat sinking unit is a critical part of the Morita et al. invention. In addition, U.S. Pat. No. 6,482,520 to Tzeng discloses the use of sheets of compressed particles of exfoliated graphite as heat spreaders (referred to in the patent as thermal interfaces) for a heat source such as an electronic component. Indeed, such materials are commercially available from Advanced Energy Technology Inc. of Lakewood, Ohio as its eGraM SpreaderShield class of materials. The graphite heat spreaders of Tzeng are positioned between a heat generating electronic component and, advantageously, a heat sink, to increase the effective surface area of the heat generating component; the Tzeng patent does not address the specific thermal issues occasioned by display devices.

Graphites are made up of layer planes of hexagonal arrays or networks of carbon atoms. These layer planes of hexagonally arranged carbon atoms are substantially flat and are oriented or ordered so as to be substantially parallel and equidistant to one another. The substantially flat, parallel equidistant sheets or layers of carbon atoms, usually referred to as graphene layers or basal planes, are linked or bonded together and groups thereof are arranged in crystallites. Highly ordered graphites consist of crystallites of considerable size: the crystallites being highly aligned or oriented with respect to each other and having well ordered carbon layers. In other words, highly ordered graphites have a high degree of preferred crystallite orientation. It should be noted that graphites possess anisotropic structures and thus exhibit or possess many properties that are highly directional e.g. thermal and electrical conductivity and fluid diffusion.

Briefly, graphites may be characterized as laminated structures of carbon, that is, structures consisting of superposed layers or laminae of carbon atoms joined together by weak van der Waals forces. In considering the graphite structure, two axes or directions are usually noted, to wit, the "c" axis or direction and the "a" axes or directions. For simplicity, the "c" axis or direction may be considered as the direction perpendicular to the carbon layers. The "a" axes or directions may be considered as the directions parallel to the carbon layers or the directions perpendicular to the "c" direction. The graphites suitable for manufacturing flexible graphite sheets possess a very high degree of orientation.

As noted above, the bonding forces holding the parallel layers of carbon atoms together are only weak van der Waals forces. Natural graphites can be treated so that the spacing between the superposed carbon layers or laminae can be appreciably opened up so as to provide a marked expansion in the direction perpendicular to the layers, that is, in the "c" direction, and thus form an expanded or intumesced graphite structure in which the laminar character of the carbon layers is substantially retained.

Graphite flake which has been greatly expanded and more particularly expanded so as to have a final thickness or "c" direction dimension which is as much as about 80 or more times the original "c" direction dimension can be formed without the use of a binder into cohesive or integrated sheets of expanded graphite, e.g. webs, papers, strips, tapes, foils, mats or the like (typically referred to as "flexible graphite"). The formation of graphite particles which have been expanded to have a final thickness or "c" dimension which is as much as about 80 times or more the original "c" direction dimension into integrated flexible sheets by compression, without the use of any binding material, is believed to be possible due to the mechanical interlocking, or cohesion, which is achieved between the voluminously expanded graphite particles.

In addition to flexibility, the sheet material, as noted above, has also been found to possess a high degree of anisotropy with respect to thermal and electrical conductivity and fluid diffusion, comparable to the natural graphite starting material due to orientation of the expanded graphite particles and graphite layers substantially parallel to the opposed faces of the sheet resulting from very high compression, e.g. roll pressing. Sheet material thus produced has excellent flexibility, good strength and a very high degree of orientation.

Briefly, the process of producing flexible, binderless anisotropic graphite sheet material, e.g. web, paper, strip, tape, foil, mat, or the like, comprises compressing or compacting under a predetermined load and in the absence of a binder, expanded graphite particles which have a "c" direction dimension which is as much as about 80 or more times that of the original particles so as to form a substantially flat, flexible, integrated graphite sheet. The expanded graphite particles that generally are worm-like or vermiform in appearance, once compressed, will maintain the compression set and alignment with the opposed major surfaces of the sheet. The density and thickness of the sheet material can be varied by controlling the degree of compression. The density of the sheet material can be within the range of from about 0.04 $g/cm^3$ to about 2.0 $g/cm^3$. The flexible graphite sheet material exhibits an appreciable degree of anisotropy due to the alignment of graphite particles parallel to the major opposed, parallel surfaces of the sheet, with the degree of anisotropy increasing upon roll pressing of the sheet material to increase orientation. In roll pressed anisotropic sheet material, the thickness, i.e. the direction perpendicular to the opposed, parallel sheet surfaces comprises the "c" direction and the directions ranging along the length and width, i.e. along or parallel to the opposed, major surfaces comprises the "a" directions and the thermal, electrical and fluid diffusion properties of the sheet are very different, by orders of magnitude, for the "c" and "a" directions.

While the use of sheets of compressed particles of exfoliated graphite (i.e., flexible graphite) has been suggested as thermal spreaders, thermal interfaces and as component parts of heat sinks for dissipating the heat generated by a heat source (see, for instance, U.S. Pat. Nos. 6,245,400; 6,482,520; 6,503,626; and 6,538,892), the use of graphite materials has heretofore been independent, and not viewed as interrelated with other components, such as the frame system of display panels.

Conventional display devices typically utilize a thick, heavy metal support member (often a thick aluminum sheet, or set of multiple sheets) to which is attached both the display panel unit and associated electronic components, such as printed circuit boards. Heat passing from these electronic components contributes to uneven temperature distributions created on the panel unit itself, which adversely affects the image presented on the display panels. Typically, the panel unit is attached to the support member using a two-sided adhesive tape material. Alternatively, the panel unit is sometimes attached directly to the support member using a full sheet of thermally conductive adhesive material, which is commonly a particle-filled acrylic or silicone.

In either case, the conventional support member provides both a mechanical function (i.e., for mounting the panel unit and associated electronics), as well as a thermal function (i.e., to help sink and spread heat generated by the panel unit and/or the associated electronics). Accordingly, the support member is typically fabricated from a solid sheet of aluminum, on the order of about 2.0 mm thick. Expressed another way, the conventional display panel having a support member exhibits a support factor of about 440 mm-W/m° K or higher. The support factor is determined by multiplying the thickness of the support member present in the display panel by its in-plane thermal conductivity (thus, a 2.0 mm sheet of aluminum has a support factor of 440 mm-W/m° K, since the in-plane thermal conductivity of the high thermal conductivity aluminum employed is 220 W/m° K). It will be recognized that, since most metals are relatively thermally isotropic, the in-plane thermal conductivity is not substantially different from the through-plane thermal conductivity of the material.

A support member such as this can weigh about 10 pounds or more, and can be expensive and difficult to construct, due to certain flatness requirements, the need for many threaded mounting features for the electronics, and the high cost of high thermal conductivity aluminum sheet. Additionally, a framework (often made from steel or aluminum) is used to add further mechanical support to the support member, and allow for a robust mounting means for attachment of the display panel to a wall bracket or stand unit. Together, the framework and support member constitute a frame system in the conventional display panel.

Conventional display device manufacturers, especially PDP manufacturers, are under extreme pressure to reduce the cost and weight of their existing display solutions, while there has simultaneously been a desire to increase the brightness and luminous efficiency of the panel units. This can mean more power being sent to the display, which increases the thermal load on the system and requires additional heat dissipation capabilities within the display units. Active cooling solutions, such as fans and/or heat pipes, are undesirable due to unreliability, noise, and the fact that they contribute negatively to the cost and weight of the system. In addition to increasing brightness and luminous efficiency of the displays, display manufacturers are also under increasing pressure to produce larger panel sizes, which tends to increase the weight of the frame system (especially the support member) proportionately.

Thus, what is desired is a light weight and cost effective frame system for display devices, especially one which provides enhanced heat transfer capabilities, yet is structurally sound enough to provide both the attachment for the panel units and associated electronics, as well as the structural integrity for mounting and supporting the display device itself. The desired frame system reduces or eliminates the need for a support member, especially one formed of high conductivity aluminum.

SUMMARY OF THE INVENTION

Accordingly, it is an object of the present invention to provide a frame system for a display device such as a plasma display panel, a liquid crystal display or the like, which is lightweight and structurally sound.

Another object of the present invention is to provide a frame system for a display device which comprises a framework disposed between the heat spreading element of the display device and the control systems, which can be printed circuit boards, of the display device.

Still another object of the present invention is to provide a frame system for a display device comprising a framework that includes a perimeter edge providing structural integrity to the display device.

Another object of the present invention is to provide a frame for a display device having an internal aperture to facilitate heat transfer and dissipation by the heat dispersion material within the display device.

Still another object of the present invention is to provide a frame system for a display device comprising a support member other than a heavy aluminum sheet or set of sheets.

These objects, and others which will be apparent to the skilled artisan upon reading the following description, can be achieved by providing a image display device comprising a display panel unit, a heat dispersion material positioned proximate (and preferably adhered) to the display panel unit, and a frame system having a support factor less than about 375 mm-W/m° K, wherein the frame system comprises a framework and a plurality of electronic components such as printed circuit boards engaging the framework. More preferably, the frame system has a support factor less than about 150 mm-W/m° K, and in the most preferred embodiment the frame system exhibits a support factor of 0 mm-W/m° K; that is, the frame system has no support member altogether. In another embodiment of the invention, the heat dispersion material can be an element of the frame system, where the heat dispersion material is disposed on either the framework or the support member (when present), as opposed to the display panel unit itself.

The framework can be composed of steel, aluminum, or other structural material and can be screwed, bolted, adhesively bonded, or otherwise securely fastened to the support member, when present. If no support member is present, the framework can be directly attached to the heat dispersion material, such as using an adhesive. In such a case, the framework can include a height and a width wherein the heat dispersion material substantially spans the height and the width. Additionally, at least one cross support can span the framework and at least one printed circuit board can engage the cross support or any of the remaining framework. While such an arrangement for the framework is preferred, other similar arrangements, such as two "I"-shaped pieces, reminiscent of the Roman numeral II, can also be employed as the framework.

When a support member is present, the heat dispersion material is preferably positioned between the display panel unit and the support member. Alternatively, support member can be positioned proximate to the display panel unit, between the heat dispersion material and the display panel unit, provided the support member is sufficiently thin and/or thermally conductive to permit effective heat transfer from the display panel unit to the heat dispersion material.

In another embodiment, the display panel unit includes an image display side and the heat dispersion material is positioned proximate to the display panel unit opposite the image display side. A perimeter framework is positioned proximate to the heat dispersion material on the opposite side of the heat dispersions material as the display panel unit, wherein the perimeter framework includes a top, a bottom, a first side, and a second side. A plurality of electronic components, such as printed circuit boards engages the perimeter frame. The top, bottom, first side, and second side of the perimeter framework define an aperture wherein the heat dispersion material substantially spans the aperture and can engage the top, bottom, first side and second side of the perimeter framework. The display panel unit can be a plasma display panel or a liquid crystal display panel, while the heat dispersion material can be composed of graphite.

In another embodiment the image display device includes a heat dispersion material positioned proximate to the display panel unit. A framework is positioned proximate to the heat dispersion material and opposite the display panel unit. The framework includes a height, a width, and an aperture substantially spanning the height and the width. A plurality of electronic components such as printed circuit boards engage the framework and are substantially aligned within the framework, and can be positioned to overlap the aperture.

Where a support member is present, it is generally configured as a sheet, and it is positioned against the framework, generally between the framework and the display panel unit. The support member, when present, can comprise a metal having a thermal conductivity lower than that previously thought sufficient to provide effective heat dissipation in a display panel, even one utilizing a graphite or other type of heat dispersion material. For instance, rather than the use of a thick sheet of high thermal conductivity aluminum, a sheet of steel having an in-plane thermal conductivity on the order of less than about 20 W/m° K can be employed. Since steel is substantially less expensive than high thermal conductivity aluminum, this results in substantial savings, even if used at the same thickness levels of high thermal conductivity aluminum, 2.0 mm. Such a steel sheet would provide the unit with a support factor of 40 mm-W/m° K. Alternatively, the support member can be high thermal conductivity aluminum, but employed as a substantially thinner sheet than previously thought feasible, even in a display panel unit utilizing a graphite or other type of heat dispersion material. For instance, a sheet of high thermal conductivity aluminum of a thickness of 0.5 mm would provide a support factor of about 110 mm-W/m° K, resulting in a much lighter weight structure. Of course, when the support member is eliminated altogether, the resulting frame system thus has a support factor of 0 mm-W/m° K, and both weight savings and cost savings are substantial.

As noted, the heat dispersion material employed is formed of graphite, and is preferably formed from sheets of compressed particles of exfoliated graphite, commonly known as flexible graphite. Graphite is a crystalline form of carbon comprising atoms covalently bonded in flat layered planes with weaker bonds between the planes. By treating particles of graphite, such as natural graphite flake, with an intercalant of, e.g. a solution of sulfuric and nitric acid, the crystal structure of the graphite reacts to form a compound of graphite and the intercalant. The treated particles of graphite are hereafter referred to as "particles of intercalated graphite." Upon exposure to high temperature, the intercalant within the graphite decomposes and volatilizes, causing the particles of intercalated graphite to expand in dimension as much as about 80 or more times its original volume in an accordion-like fashion in the "c" direction, i.e. in the direction perpendicular to the crystalline planes of the graphite. The exfoliated graphite particles are vermiform in appearance, and are therefore commonly referred to as worms. The worms may be compressed together into flexible sheets that, unlike the original graphite flakes, can be formed and cut into various shapes.

Graphite starting materials suitable for use in the present invention include highly graphitic carbonaceous materials capable of intercalating organic and inorganic acids as well as halogens and then expanding when exposed to heat. These highly graphitic carbonaceous materials most preferably have a degree of graphitization of about 1.0. As used in this disclosure, the term "degree of graphitization" refers to the value g according to the formula:

$$g = \frac{3.45 - d(002)}{0.095}$$

where d(002) is the spacing between the graphitic layers of the carbons in the crystal structure measured in Angstrom units. The spacing d between graphite layers is measured by standard X-ray diffraction techniques. The positions of diffraction peaks corresponding to the (002), (004) and (006) Miller Indices are measured, and standard least-squares techniques are employed to derive spacing which minimizes the total error for all of these peaks. Examples of highly graphitic carbonaceous materials include natural graphites from various sources, as well as other carbonaceous materials such as graphite prepared by chemical vapor deposition, high temperature pyrolysis of polymers, or crystallization from molten metal solutions and the like. Natural graphite is most preferred.

The graphite starting materials used in the present invention may contain non-graphite components so long as the crystal structure of the starting materials maintains the required degree of graphitization and they are capable of exfoliation. Generally, any carbon-containing material, the crystal structure of which possesses the required degree of graphitization and which can be exfoliated, is suitable for use with the present invention. Such graphite preferably has a purity of at least about eighty weight percent. More preferably, the graphite employed for the present invention will have a purity of at least about 94%. In the most preferred embodiment, the graphite employed will have a purity of at least about 98%.

A common method for manufacturing graphite sheet is described by Shane et al. in U.S. Pat. No. 3,404,061, the disclosure of which is incorporated herein by reference. In the typical practice of the Shane et al. method, natural graphite flakes are intercalated by dispersing the flakes in a solution containing e.g., a mixture of nitric and sulfuric acid, advantageously at a level of about 20 to about 300 parts by weight of intercalant solution per 100 parts by weight of graphite flakes (pph). The intercalation solution contains oxidizing and other intercalating agents known in the art. Examples include those containing oxidizing agents and oxidizing mixtures, such as solutions containing nitric acid, potassium chlorate, chromic acid, potassium permanganate, potassium chromate, potassium dichromate, perchloric acid, and the like, or mixtures, such as for example, concentrated nitric acid and chlorate, chromic acid and phosphoric acid, sulfuric acid and nitric acid, or mixtures of a strong organic acid, e.g. trifluoroacetic acid, and a strong oxidizing agent soluble in the organic acid. Alternatively, an electric potential can be used to bring about oxidation of the graphite. Chemical species that can be introduced into the graphite crystal using electrolytic oxidation include sulfuric acid as well as other acids.

In a preferred embodiment, the intercalating agent is a solution of a mixture of sulfuric acid, or sulfuric acid and phosphoric acid, and an oxidizing agent, i.e. nitric acid, perchloric acid, chromic acid, potassium permanganate, hydrogen peroxide, iodic or periodic acids, or the like. Although less preferred, the intercalation solution may contain metal halides such as ferric chloride, and ferric chloride mixed with sulfuric acid, or a halide, such as bromine as a solution of bromine and sulfuric acid or bromine in an organic solvent.

The quantity of intercalation solution may range from about 20 to about 350 pph and more typically about 40 to about 160 pph. After the flakes are intercalated, any excess solution is drained from the flakes and the flakes are water-washed. Alternatively, the quantity of the intercalation solution may be limited to between about 10 and about 40 pph, which permits the washing step to be eliminated as taught and described in U.S. Pat. No. 4,895,713, the disclosure of which is also herein incorporated by reference.

The particles of graphite flake treated with intercalation solution can optionally be contacted, e.g. by blending, with a reducing organic agent selected from alcohols, sugars, aldehydes and esters which are reactive with the surface film of oxidizing intercalating solution at temperatures in the range of 25° C. and 125° C. Suitable specific organic agents include hexadecanol, octadecanol, 1-octanol, 2-octanol, decylalcohol, 1,10 decanediol, decylaldehyde, 1-propanol, 1,3 propanediol, ethyleneglycol, polypropylene glycol, dextrose, fructose, lactose, sucrose, potato starch, ethylene glycol monostearate, diethylene glycol dibenzoate, propylene glycol monostearate, glycerol monostearate, dimethyl oxylate, diethyl oxylate, methyl formate, ethyl formate, ascorbic acid and lignin-derived compounds, such as sodium lignosulfate. The amount of organic reducing agent is suitably from about 0.5 to 4% by weight of the particles of graphite flake.

The use of an expansion aid applied prior to, during or immediately after intercalation can also provide improvements. Among these improvements can be reduced exfoliation temperature and increased expanded volume (also referred to as "worm volume"). An expansion aid in this context will advantageously be an organic material sufficiently soluble in the intercalation solution to achieve an improvement in expansion. More narrowly, organic materials of this type that contain carbon, hydrogen and oxygen, preferably exclusively, may be employed. Carboxylic acids have been found especially effective. A suitable carboxylic acid useful as the expansion aid can be selected from aromatic, aliphatic or cycloaliphatic, straight chain or branched chain, saturated and unsaturated monocarboxylic acids, dicarboxylic acids and polycarboxylic acids which have at least 1 carbon atom, and preferably up to about 15 carbon atoms, which is soluble in the intercalation solution in amounts effective to provide a measurable improvement of one or more aspects of exfoliation. Suitable organic solvents can be employed to improve solubility of an organic expansion aid in the intercalation solution.

Representative examples of saturated aliphatic carboxylic acids are acids such as those of the formula $H(CH_2)_n COOH$ wherein n is a number of from 0 to about 5, including formic, acetic, propionic, butyric, pentanoic, hexanoic, and the like. In place of the carboxylic acids, the anhydrides or reactive carboxylic acid derivatives such as alkyl esters can also be employed. Representative of alkyl esters are methyl formate and ethyl formate. Sulfuric acid, nitric acid and other known aqueous intercalants have the ability to decompose formic acid, ultimately to water and carbon dioxide. Because of this, formic acid and other sensitive expansion aids are advantageously contacted with the graphite flake prior to immersion of the flake in aqueous intercalant. Representative of dicarboxylic acids are aliphatic dicarboxylic acids having 2-12 carbon atoms, in particular oxalic acid, fumaric acid, malonic acid, maleic acid, succinic acid, glutaric acid, adipic acid, 1,5-pentanedicarboxylic acid, 1,6-hexanedicarboxylic acid, 1,10-decanedicarboxylic acid, cyclohexane-1,4-dicarboxylic acid and aromatic dicarboxylic acids such as phthalic acid or terephthalic acid. Representative of alkyl esters are dimethyl oxylate and diethyl oxylate. Representative of cycloaliphatic acids is cyclohexane carboxylic acid and of aromatic carboxylic acids are benzoic acid, naphthoic acid, anthranilic acid, p-aminobenzoic acid, salicylic acid, o-, m- and p-tolyl acids, methoxy and ethoxybenzoic acids, acetoacetamidobenzoic acids and, acetamidobenzoic acids, phenylacetic acid and naphthoic acids. Representative of hydroxy aromatic acids are hydroxybenzoic acid, 3-hydroxy-1-naphthoic acid, 3-hydroxy-2-naphthoic acid, 4-hydroxy-2-naphthoic acid, 5-hydroxy-1-naphthoic acid, 5-hydroxy-2-naphthoic acid, 6-hydroxy-2-naphthoic acid and 7-hydroxy-2-naphthoic acid. Prominent among the polycarboxylic acids is citric acid.

The intercalation solution will be aqueous and will preferably contain an amount of expansion aid of from about 1 to 10%, the amount being effective to enhance exfoliation. In the embodiment wherein the expansion aid is contacted with the graphite flake prior to or after immersing in the aqueous intercalation solution, the expansion aid can be admixed with the graphite by suitable means, such as a V-blender, typically in an amount of from about 0.2% to about 10% by weight of the graphite flake.

After intercalating the graphite flake, and following the blending of the intercalant coated intercalated graphite flake with the organic reducing agent, the blend is exposed to temperatures in the range of 25° to 125° C. to promote reaction of the reducing agent and intercalant coating. The heating period is up to about 20 hours, with shorter heating periods, e.g., at least about 10 minutes, for higher temperatures in the above-noted range. Times of one half hour or less, e.g., on the order of 10 to 25 minutes, can be employed at the higher temperatures.

The thusly treated particles of graphite are sometimes referred to as "particles of intercalated graphite." Upon exposure to high temperature, e.g. temperatures of at least about 160° C. and especially about 700° C. to 1000° C. and higher, the particles of intercalated graphite expand as much as about 80 to 1000 or more times their original volume in an accordion-like fashion in the c-direction, i.e. in the direction perpendicular to the crystalline planes of the constituent graphite particles. The expanded, i.e. exfoliated, graphite particles are vermiform in appearance, and are therefore commonly referred to as worms. The worms may be compressed together into flexible sheets that, unlike the original graphite flakes, can be formed and cut into various shapes.

Flexible graphite sheet and foil are coherent, with good handling strength, and are suitably compressed, e.g. by roll pressing, to a thickness of about 0.075 mm to 3.75 mm and a typical density of about 0.1 to 1.5 grams per cubic centimeter (g/cm$^3$). From about 1.5-30% by weight of ceramic additives can be blended with the intercalated graphite flakes as described in U.S. Pat. No. 5,902,762 (which is incorporated herein by reference) to provide enhanced resin impregnation in the final flexible graphite product. The additives include ceramic fiber particles having a length of about 0.15 to 1.5 millimeters. The width of the particles is suitably from about 0.04 to 0.004 mm. The ceramic fiber particles are non-reactive and non-adhering to graphite and are stable at temperatures up to about 1100° C., preferably about 1400° C. or higher. Suitable ceramic fiber particles are formed of macerated quartz glass fibers, carbon and graphite fibers, zirconia, boron nitride, silicon carbide and magnesia fibers, naturally occurring mineral fibers such as calcium metasilicate fibers, calcium aluminum silicate fibers, aluminum oxide fibers and the like.

The above described methods for intercalating and exfoliating graphite flake may beneficially be augmented by a pre-treatment of the graphite flake at graphitization temperatures, i.e. temperatures in the range of about 3000° C. and above and by the inclusion in the intercalant of a lubricious additive, as described in International Patent Application No. PCT/US02/39749.

The pretreatment, or annealing, of the graphite flake results in significantly increased expansion (i.e., increase in expansion volume of up to 300% or greater) when the flake is subsequently subjected to intercalation and exfoliation. Indeed, desirably, the increase in expansion is at least about 50%, as compared to similar processing without the annealing step. The temperatures employed for the annealing step should not be significantly below 3000° C., because temperatures even 100° C. lower result in substantially reduced expansion.

The annealing of the present invention is performed for a period of time sufficient to result in a flake having an enhanced degree of expansion upon intercalation and subsequent exfoliation. Typically the time required will be 1 hour or more, preferably 1 to 3 hours and will most advantageously proceed in an inert environment. For maximum beneficial results, the annealed graphite flake will also be subjected to other processes known in the art to enhance the degree expansion—namely intercalation in the presence of an organic reducing agent, an intercalation aid such as an organic acid, and a surfactant wash following intercalation. Moreover, for maximum beneficial results, the intercalation step may be repeated.

The annealing step of the instant invention may be performed in an induction furnace or other such apparatus as is known and appreciated in the art of graphitization; for the temperatures here employed, which are in the range of 3000° C., are at the high end of the range encountered in graphitization processes.

Because it has been observed that the worms produced using graphite subjected to pre-intercalation annealing can sometimes "clump" together, which can negatively impact area weight uniformity, an additive that assists in the formation of "free flowing" worms is highly desirable. The addition of a lubricious additive to the intercalation solution facilitates the more uniform distribution of the worms across the bed of a compression apparatus (such as the bed of a calender station conventionally used for compressing (or "calendering") graphite worms into flexible graphite sheet. The resulting sheet therefore has higher area weight uniformity and greater tensile strength. The lubricious additive is preferably a long chain hydrocarbon, more preferably a hydrocarbon having at least about 10 carbons. Other organic compounds having long chain hydrocarbon groups, even if other functional groups are present, can also be employed.

More preferably, the lubricious additive is an oil, with a mineral oil being most preferred, especially considering the fact that mineral oils are less prone to rancidity and odors, which can be an important consideration for long term storage. It will be noted that certain of the expansion aids detailed above also meet the definition of a lubricious additive. When these materials are used as the expansion aid, it may not be necessary to include a separate lubricious additive in the intercalant.

The lubricious additive is present in the intercalant in an amount of at least about 1.4 pph, more preferably at least about 1.8 pph. Although the upper limit of the inclusion of lubricous additive is not as critical as the lower limit, there does not appear to be any significant additional advantage to including the lubricious additive at a level of greater than about 4 pph.

The thus treated particles of graphite are sometimes referred to as "particles of intercalated graphite." Upon exposure to high temperature, e.g. temperatures of at least about 160° C. and especially about 700° C. to 1200° C. and higher, the particles of intercalated graphite expand as much as about 80 to 1000 or more times their original volume in an accordion-like fashion in the c-direction, i.e. in the direction perpendicular to the crystalline planes of the constituent graphite particles. The expanded, i.e. exfoliated, graphite particles are vermiform in appearance, and are therefore commonly referred to as worms. The worms may be compressed together into flexible sheets that, unlike the original graphite flakes, can be formed and cut into various shapes and provided with small transverse openings by deforming mechanical impact as hereinafter described.

Flexible graphite sheet and foil are coherent, with good handling strength, and are suitably compressed, e.g. by roll-pressing, to a thickness of about 0.075 mm to 3.75 mm and a typical density of about 0.1 to 1.5 grams per cubic centimeter (g/cc). From about 1.5-30% by weight of ceramic additives can be blended with the intercalated graphite flakes as described in U.S. Pat. No. 5,902,762 (which is incorporated herein by reference) to provide enhanced resin impregnation in the final flexible graphite product. The additives include ceramic fiber particles having a length of about 0.15 to 1.5 millimeters. The width of the particles is suitably from about 0.04 to 0.004 mm. The ceramic fiber particles are non-reactive and non-adhering to graphite and are stable at temperatures up to about 1100° C., preferably about 1400° C. or higher. Suitable ceramic fiber particles are formed of macerated quartz glass fibers, carbon and graphite fibers, zirconia, boron nitride, silicon carbide and magnesia fibers, naturally occurring mineral fibers such as calcium metasilicate fibers, calcium aluminum silicate fibers, aluminum oxide fibers and the like.

The flexible graphite sheet can also, at times, be advantageously treated with resin and the absorbed resin, after curing, enhances the moisture resistance and handling strength, i.e. stiffness, of the flexible graphite sheet as well as "fixing" the morphology of the sheet. Suitable resin content is preferably at least about 5% by weight, more preferably about 10 to 35% by weight, and suitably up to about 60% by weight. Resins found especially useful in the practice of the present invention include acrylic-, epoxy- and phenolic-based resin systems, fluoro-based polymers, or mixtures thereof. Suitable epoxy resin systems include those based on diglycidyl ether of bisphenol A (DGEBA) and other multifunctional resin systems; phenolic resins that can be employed include resole and novolac phenolics. Optionally, the flexible graphite may be impregnated with fibers and/or salts in addition to the resin or in place of the resin. Additionally, reactive or non-reactive additives may be employed with the resin system to modify properties (such as tack, material flow, hydrophobicity, etc.).

Alternatively, the flexible graphite sheets of the present invention may utilize particles of reground flexible graphite sheets rather than freshly expanded worms, as discussed in International Patent Application No. PCT/US02/16730. The sheets may be newly formed sheet material, recycled sheet material, scrap sheet material, or any other suitable source.

Also the processes of the present invention may use a blend of virgin materials and recycled materials.

The source material for recycled materials may be sheets or trimmed portions of sheets that have been compression molded as described above, or sheets that have been compressed with, for example, pre-calendering rolls, but have not yet been impregnated with resin. Furthermore, the source material may be sheets or trimmed portions of sheets that have been impregnated with resin, but not yet cured, or sheets or trimmed portions of sheets that have been impregnated with resin and cured. The source material may also be recycled flexible graphite proton exchange membrane (PEM) fuel cell components such as flow field plates or electrodes. Each of the various sources of graphite may be used as is or blended with natural graphite flakes.

Once the source material of flexible graphite sheets is available, it can then be comminuted by known processes or devices, such as a jet mill, air mill, blender, etc. to produce particles. Preferably, a majority of the particles have a diameter such that they will pass through 20 U.S. mesh; more preferably a major portion (greater than about 20%, most preferably greater than about 50%) will not pass through 80 U.S. mesh. Most preferably the particles have a particle size of no greater than about 20 mesh. It may be desirable to cool the flexible graphite sheet when it is resin-impregnated as it is being comminuted to avoid heat damage to the resin system during the comminution process.

The size of the comminuted particles may be chosen so as to balance machinability and formability of the graphite article with the thermal characteristics desired. Thus, smaller particles will result in a graphite article which is easier to machine and/or form, whereas larger particles will result in a graphite article having higher anisotropy, and, therefore, greater in-plane electrical and thermal conductivity.

If the source material has been resin impregnated, then preferably the resin is removed from the particles. Details of the resin removal are further described below.

Once the source material is comminuted, and any resin is removed, it is then re-expanded. The re-expansion may occur by using the intercalation and exfoliation process described above and those described in U.S. Pat. No. 3,404,061 to Shane et al. and U.S. Pat. No. 4,895,713 to Greinke et al.

Typically, after intercalation the particles are exfoliated by heating the intercalated particles in a furnace. During this exfoliation step, intercalated natural graphite flakes may be added to the recycled intercalated particles. Preferably, during the re-expansion step the particles are expanded to have a specific volume in the range of at least about 100 cc/g and up to about 350 cc/g or greater. Finally, after the re-expansion step, the re-expanded particles may be compressed into flexible sheets, as hereinafter described.

If the starting material has been impregnated with a resin, the resin should preferably be at least partially removed from the particles. This removal step should occur between the comminuting step and the re-expanding step.

In one embodiment, the removing step includes heating the resin containing regrind particles, such as over an open flame. More specifically, the impregnated resin may be heated to a temperature of at least about 250° C. to effect resin removal. During this heating step care should be taken to avoid flashing of the resin decomposition products; this can be done by careful heating in air or by heating in an inert atmosphere. Preferably, the heating should be in the range of from about 400° C. to about 800° C. for a time in the range of from at least about 10 and up to about 150 minutes or longer.

Additionally, the resin removal step may result in increased tensile strength of the resulting article produced from the molding process as compared to a similar method in which the resin is not removed. The resin removal step may also be advantageous because during the expansion step (i.e., intercalation and exfoliation), when the resin is mixed with the intercalation chemicals, it may in certain instances create toxic byproducts.

Thus, by removing the resin before the expansion step a superior product is obtained such as the increased strength characteristics discussed above. The increased strength characteristics are a result of in part because of increased expansion. With the resin present in the particles, expansion may be restricted.

In addition to strength characteristics and environmental concerns, resin may be removed prior to intercalation in view of concerns about the resin possibly creating a run away exothermic reaction with the acid.

In view of the above, preferably a majority of the resin is removed. More preferably, greater than about 75% of the resin is removed. Most preferably, greater than 99% of the resin is removed.

Once the flexible graphite sheet is comminuted, it is formed into the desired shape and then cured (when resin impregnated) in the preferred embodiment. Alternatively, the sheet can be cured prior to being comminuted, although post-comminution cure is preferred.

Optionally, the flexible graphite sheet used to form the inventive thermal solution can be used as a laminate, with or without an adhesive between laminate layers. Non-graphite layers may be included in the laminate stack, although this may necessitate the use of adhesives, which can be disadvantageous, as discussed above. Such non-graphite layers may include metals, plastics or other non-metallics such as fiberglass or ceramics.

As noted above, the thusly-formed sheets of compressed particles of exfoliated graphite are anisotropic in nature; that is, the thermal conductivity of the sheets is greater in the in-plane, or "a" directions, as opposed to the through-sheet, or "c" direction. In this way, the anisotropic nature of the graphite sheet directs the heat along the planar direction of the thermal solution (i.e., in the "a" direction along the graphite sheet). Such a sheet generally has a thermal conductivity in the in-plane direction of at least about 140, more preferably at least about 200, and most preferably at least about 250 W/m° K and in the through-plane direction of no greater than about 12, more preferably no greater than about 10, and most preferably no greater than about 6 W/m° K. Thus, the thermal solution has a thermal anistropic ratio (that is, the ratio of in-plane thermal conductivity to through-plane thermal conductivity) of no less than about 10.

The values of thermal conductivity in the in-plane and through-plane directions of the laminate can be manipulated by altering the directional alignment of the graphene layers of the flexible graphite sheets used to form the thermal solution, including if being used to form a laminate, or by altering the directional alignment of the graphene layers of the laminate itself after it has been formed. In this way, the in-plane thermal conductivity of the thermal solution is increased, while the through-plane thermal conductivity of the thermal solution is decreased, this resulting in an increase of the thermal anisotropic ratio.

One of the ways this directional alignment of the graphene layers can be achieved is by the application of pressure to the component flexible graphite sheets, either by calendering the sheets (i.e., through the application of shear force) or by die pressing or reciprocal platen pressing (i.e., through the application of compaction), with calendering more effective at producing directional alignment. For instance, by calendering the sheets to a density of 1.7 g/cc, as opposed to 1.1 g/cc, the in-plane thermal conductivity is increased from about 240 W/m° K to about 450 W/m° K or higher, and the through-plane thermal conductivity is decreased proportionally, thus increasing the thermal anisotropic ratio of the individual sheets and, by extension, any laminate formed therefrom.

Alternatively, if a laminate is formed, the directional alignment of the graphene layers which make up the laminate in gross is increased, such as by the application of pressure, resulting in a density greater than the starting density of the component flexible graphite sheets that make up the laminate. Indeed, a final density for the laminated article of at least about 1.4 g/cc, more preferably at least about 1.6 g/cc, and up to about 2.0 g/cc can be obtained in this manner. The pressure can be applied by conventional means, such as by die pressing or calendering. Pressures of at least about 60 megapascals (MPa) are preferred, with pressures of at least about 550 MPa, and more preferably at least about 700 MPa, needed to achieve densities as high as 2.0 g/cc.

Surprisingly, increasing the directional alignment of the graphene layers can increase the in-plane thermal conductivity of the graphite laminate to conductivities which are equal to or even greater than that of pure copper, while the density remains a fraction of that of pure copper. Additionally, the resulting aligned laminate also exhibits increased strength, as compared to a non-"aligned" laminate.

Surprisingly, by use of such a graphite-based heat dispersion material, the reduction of the support factor for the frame system, indeed the elimination of a support member entirely, can be effected while still providing the necessary mechanical support and effective heat dissipation.

Also included is a method of making a frame system for an image display device. The method includes providing a display panel unit, a heat dispersion material, a framework, and at least one electronic component, such as a printed circuit board. The method includes positioning the heat dispersion material between the display panel unit and the framework and positioning at least one electronic component such as a printed circuit board on the framework to control the display of an image on the display panel unit.

It is to be understood that both the foregoing general description and the following detailed description provide embodiments of the invention and are intended to provide an overview or structure of understanding of the nature and character of the invention as it is claimed. The accompanying drawings are included to provide a further understanding of the invention and are incorporated in and constitute a part of the specification. The drawings illustrate various embodiments of the invention and together with the description serve to describe the principles and operations of the invention.

BRIEF DESCRIPTION OF THE DRAWINGS

FIG. 4 is a side perspective view similar to FIG. 3. FIG. 4 shows an example of the heat dissipation material positioned in the frame system.

FIG. 5 shows the frame system and heat dissipation material positioned proximate to an image display screen.

FIG. 6 shows printed circuit boards positioned on the framework while the framework and heat dissipation material are positioned proximate to the image display panel.

FIG. 7 shows cross supports positioned to engage the frame while the remaining components are aligned and substantially positioned proximate to one another.

FIG. 12 shows an example of an adhesive applied to the flange of the framework.

FIG. 13 shows heat dispersing material and adhesive positioned on the flange of the frame.

DETAILED DESCRIPTION OF THE PREFERRED EMBODIMENTS

Figure 1:
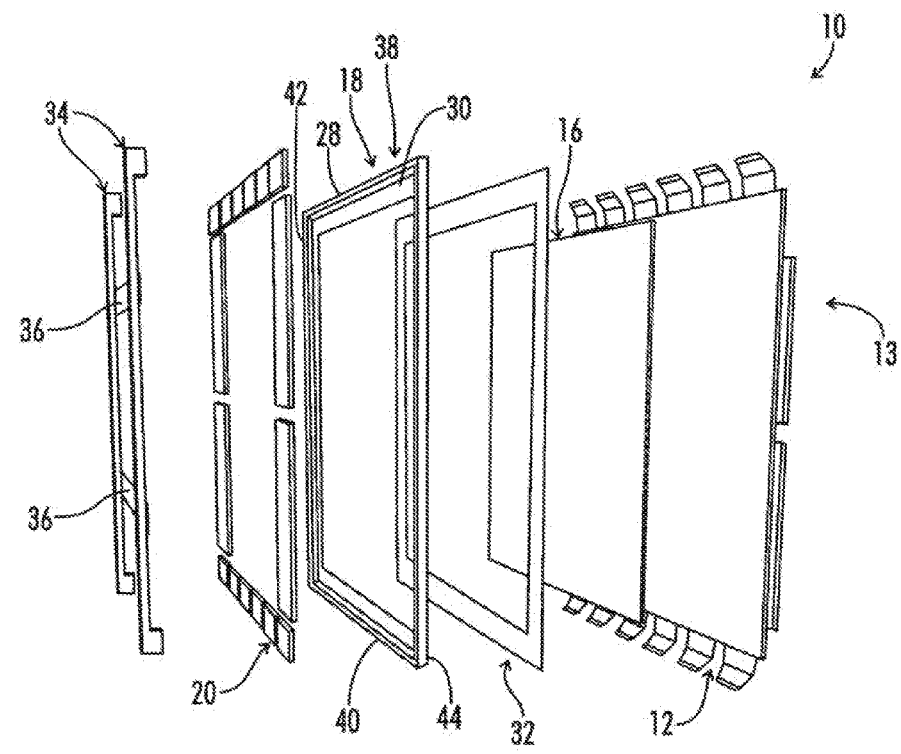
FIG. 1 is a side perspective view showing an example of the elements of an embodiment of an image display device made in accordance with the current disclosure.
Figure 2:
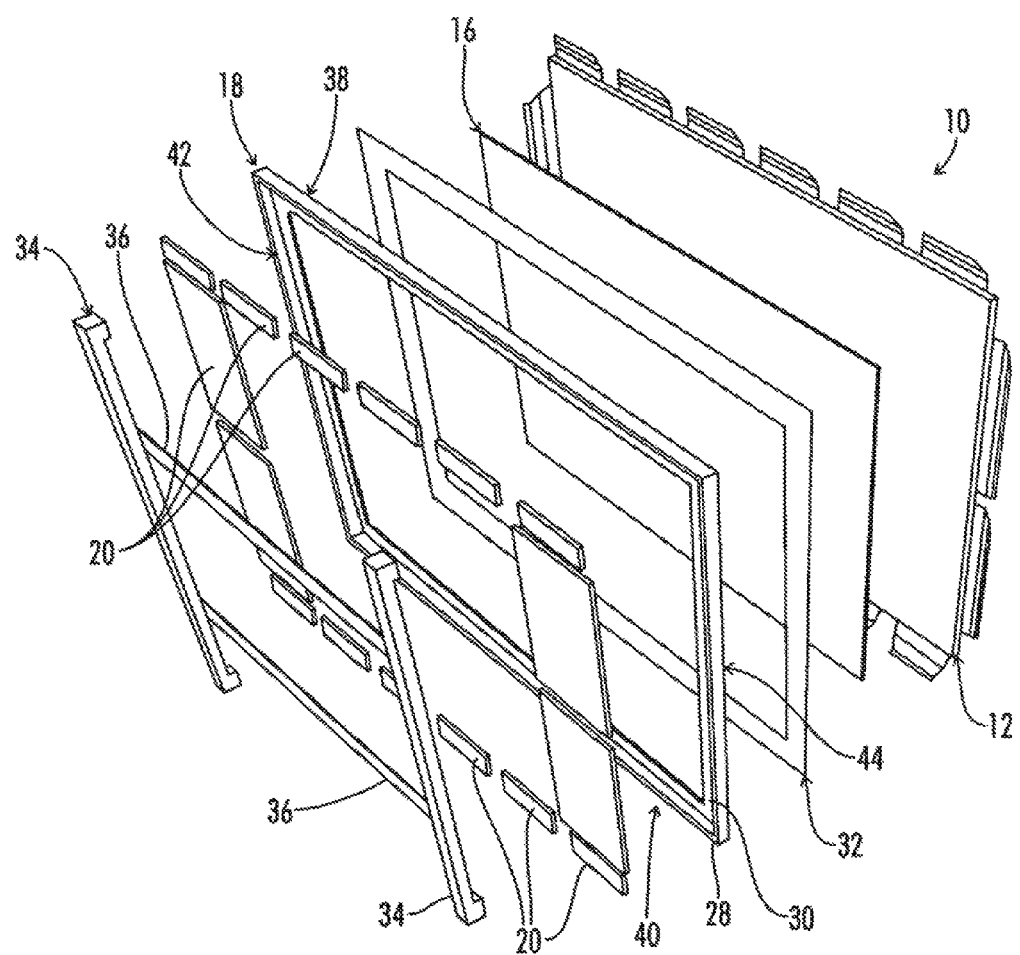
FIG. 2 is a top perspective view of the embodiment shown in FIG. 1.
Figure 3:
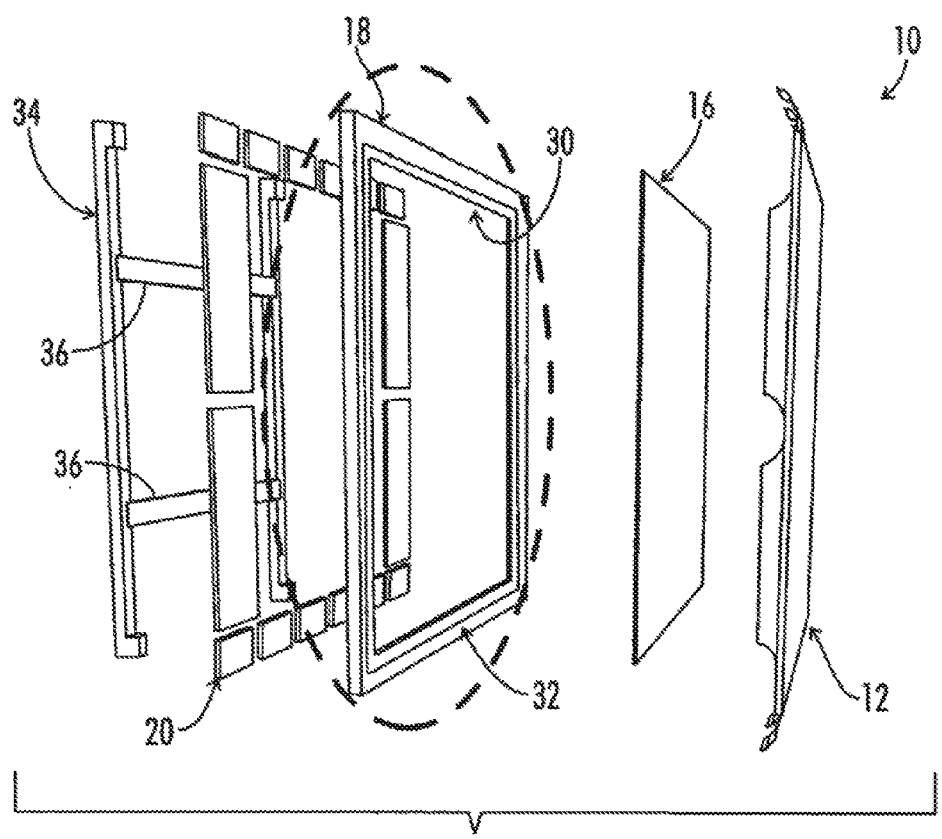
FIG. 3 is a side perspective view of the embodiments shown in FIGS. 1-2.
Figure 4:
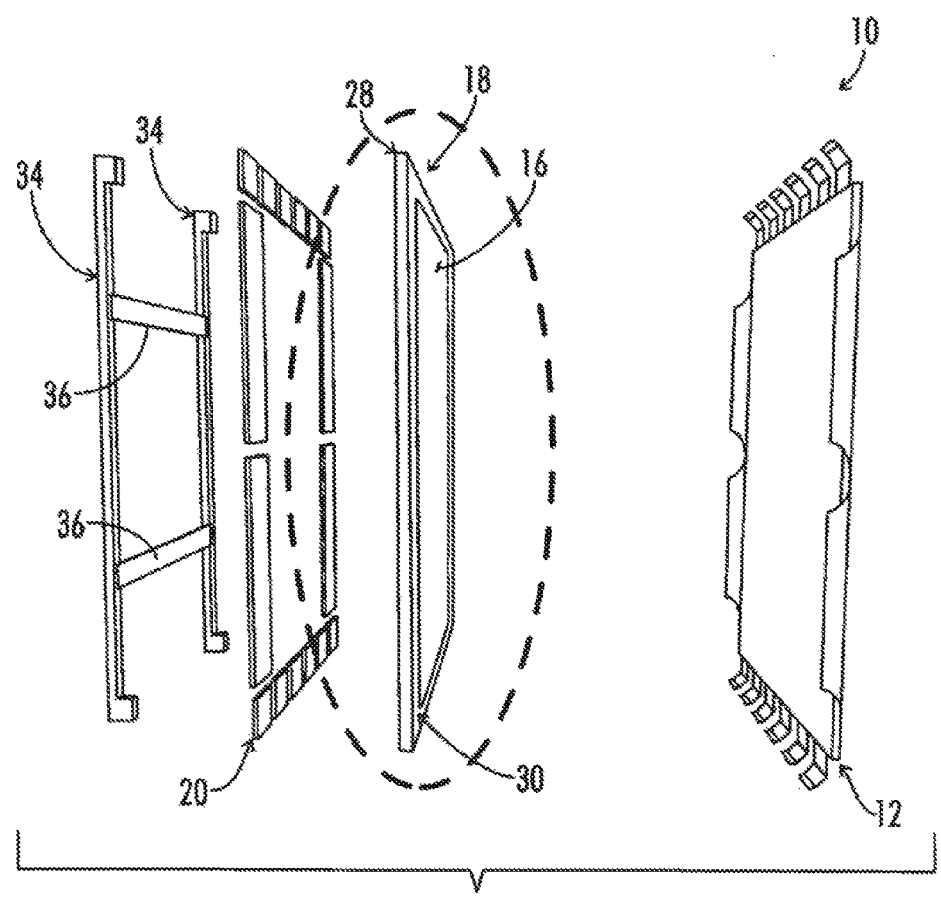
FIG. 4 shows an example of the adhesive applied to a frame system.
Figure 5:
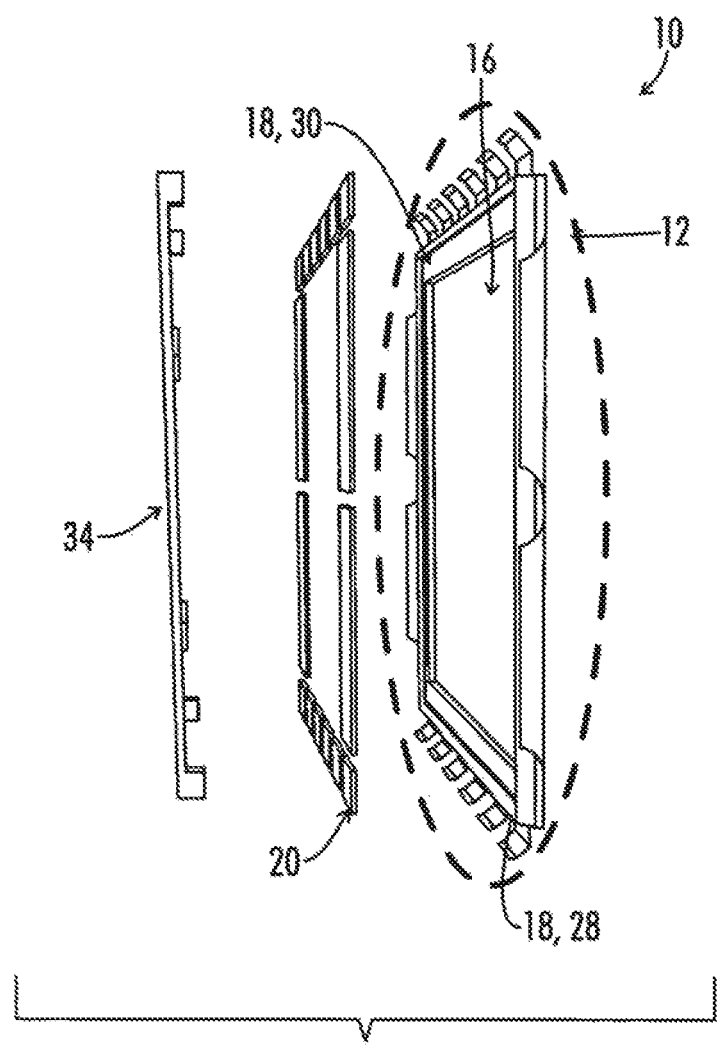
FIG. 5 is a side perspective view similar to FIGS. 3-4.
Figure 6:
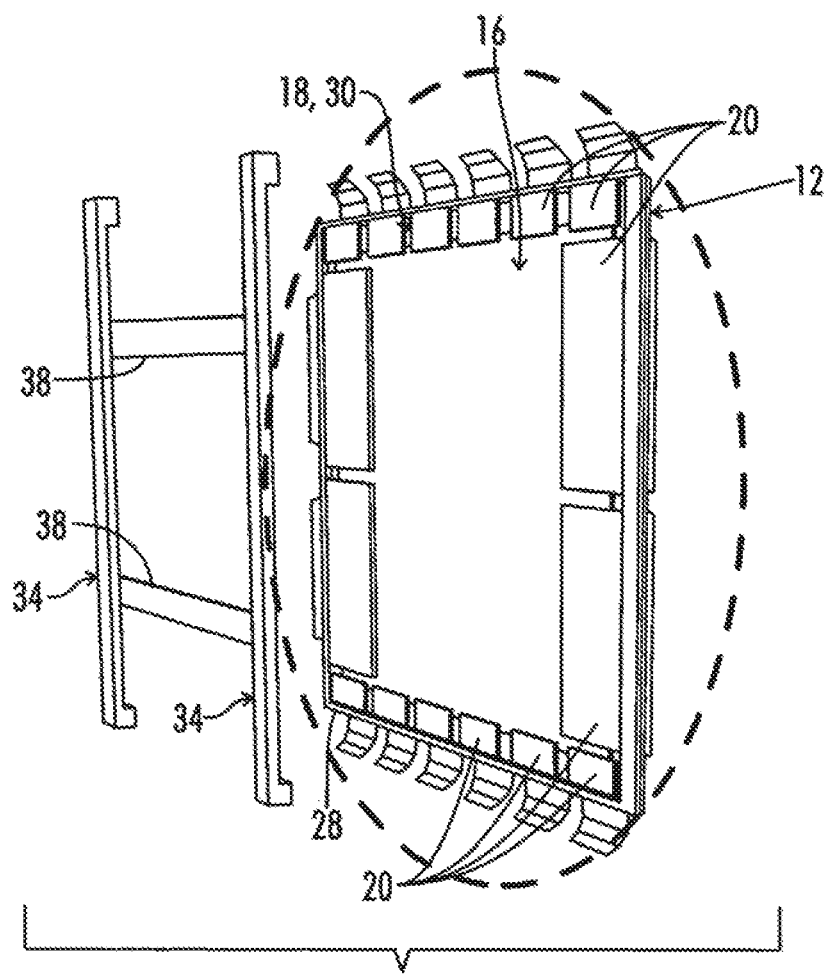
FIG. 6 is a perspective view similar to FIGS. 3-5.
Figure 7:
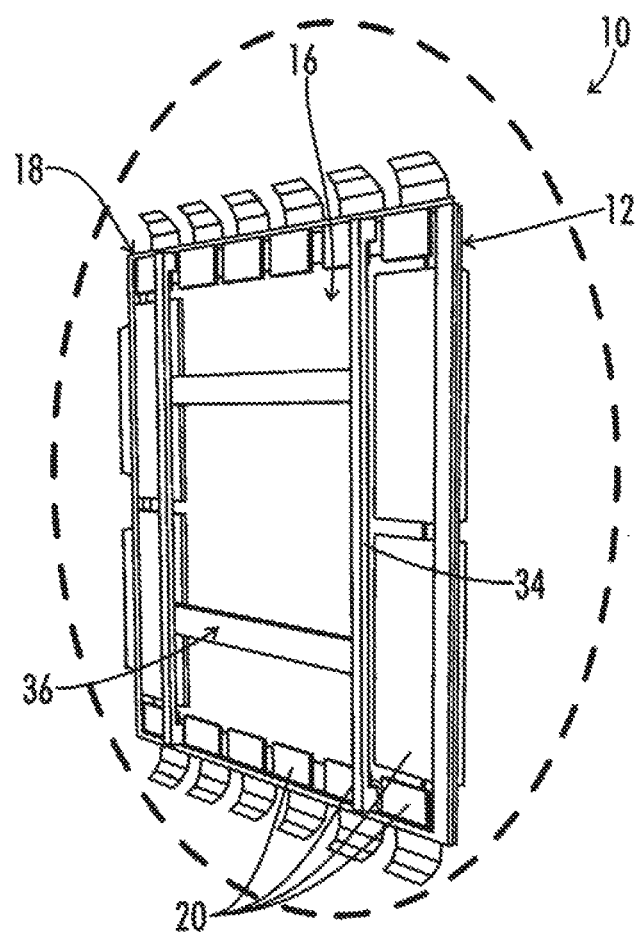
FIG. 7 is a back perspective view similar to FIGS. 3-6.
Figure 8:
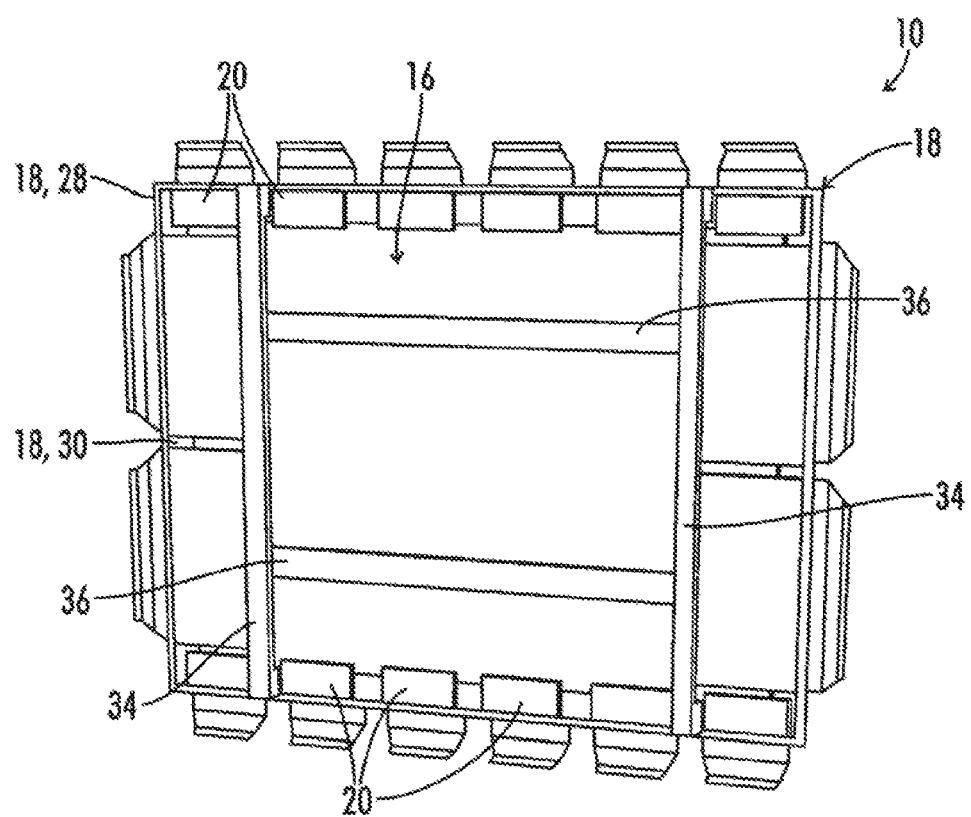
FIG. 8 is a back perspective view similar to FIG. 7.
Figure 9:
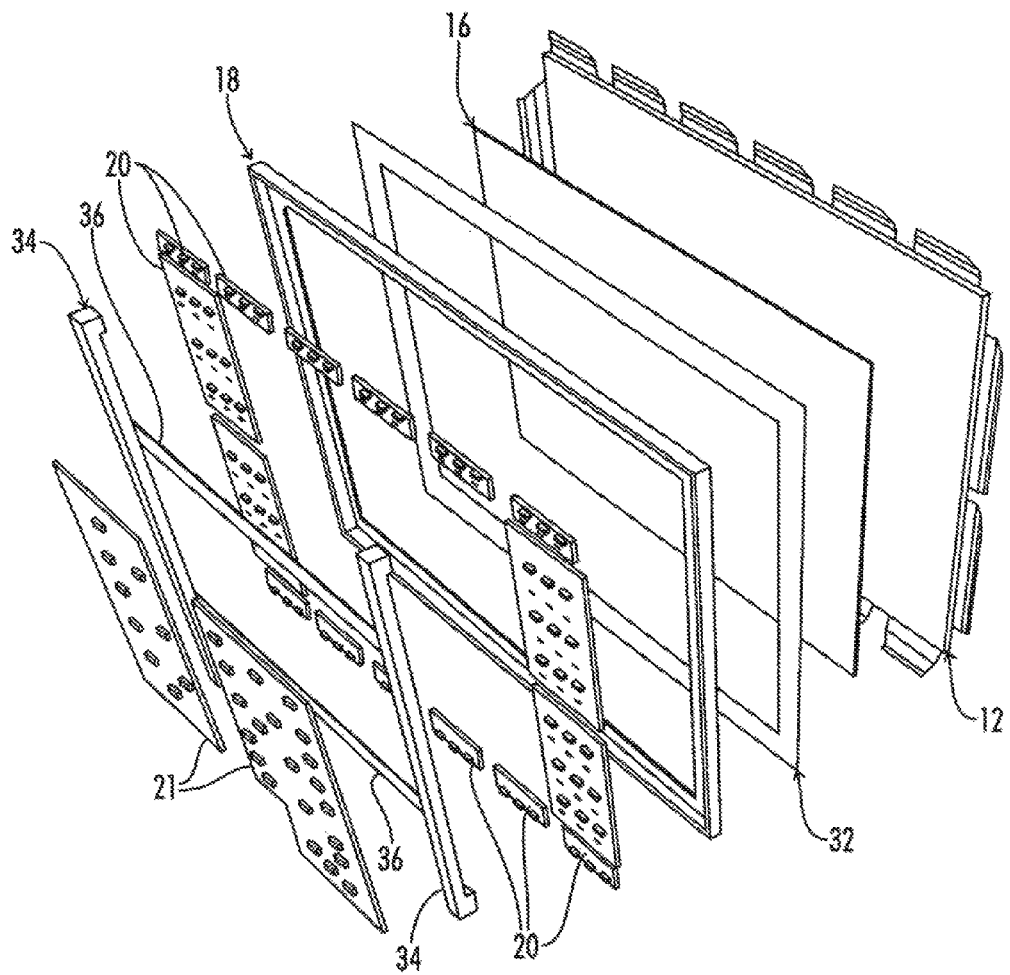
FIG. 9 is a back perspective view showing an alternate embodiment of a display device made in accordance with the current invention.

Referring generally now to FIGS. 1-13, an image display device is shown and generally designated by the numeral 10. The image display device 10 comprises an image display panel 12 for displaying an image 14, a frame system comprising a heat dispersion material 16 positioned proximate to the image display panel 12, a framework 18 positioned proximate to the heat dispersion material 16 opposite the image display panel 12, and a plurality of printed circuit boards 20 engaging the framework 18. The framework 18 includes a height 22, a width 24 and an aperture 26 substantially spanning the height 22 and width 24. The heat dispersion material 16 can substantially span the height 22 and width 24 of the framework 18.

The printed circuit boards 20 can be substantially aligned within the framework 18, and can overlap a portion of the aperture 26. This alignment facilitates the heat dispersion material 16 to dissipate heat generated by the printed circuit boards 20.

In a preferred embodiment the heat dispersion material 16 comprises graphite while the framework 18 is composed of steel. Additionally, the framework 18 includes a lip 28 positioned around the perimeter of the framework 18 and a flange 30 extending inward from the lip 28. The printed circuit boards 20 can engage the lip 28 and/or the flange 30 in order to secure the printed circuit boards 20 to the framework 18. The heat dispersion material 16 can also engage the flange 30 opposite the printed circuit boards 20. As such, the heat dispersion material 16 can substantially span the aperture 26 of the framework 18. This facilitates heat dispersion by the heat dispersion material 16 within the image display device 10.

Figure 10:
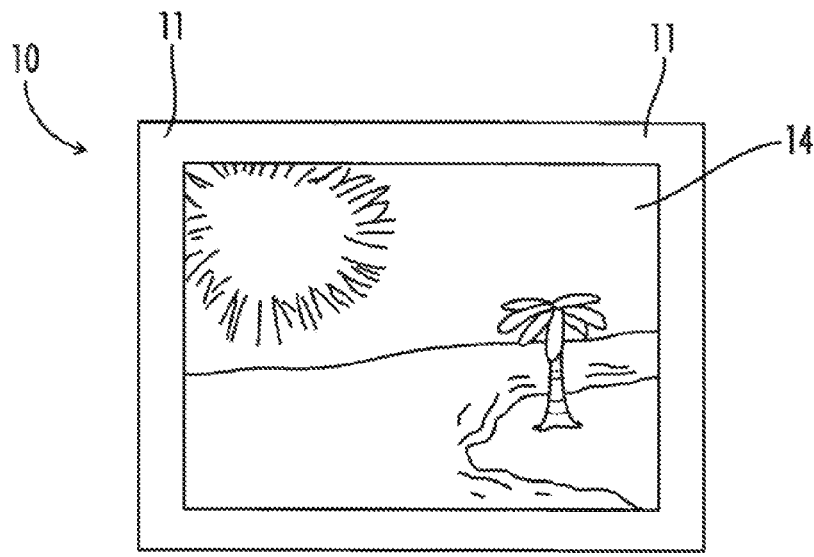
FIG. 10 is a front view of an image display device shown within a casing and having an image displayed thereon.
Figure 11:
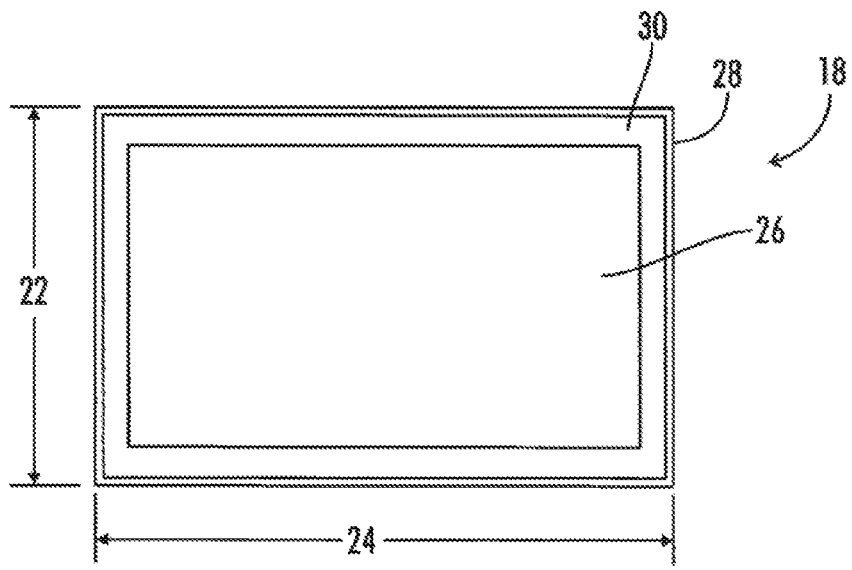
FIG. 11 is a back view of a framework made in accordance with the current invention showing an example of the lip and flange.
Figure 12:
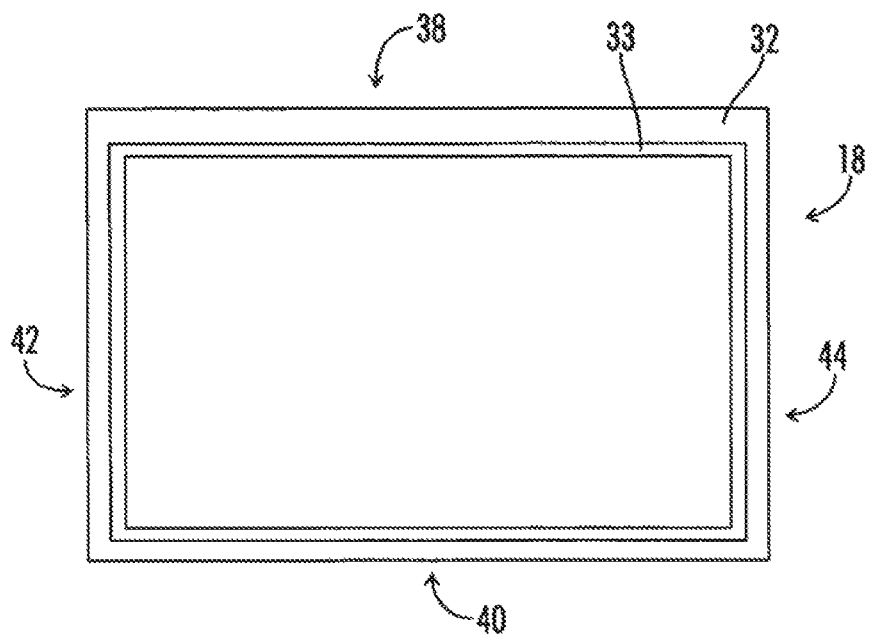
FIG. 12 is a back view of the framework made in accordance with the current disclosure.
Figure 13:
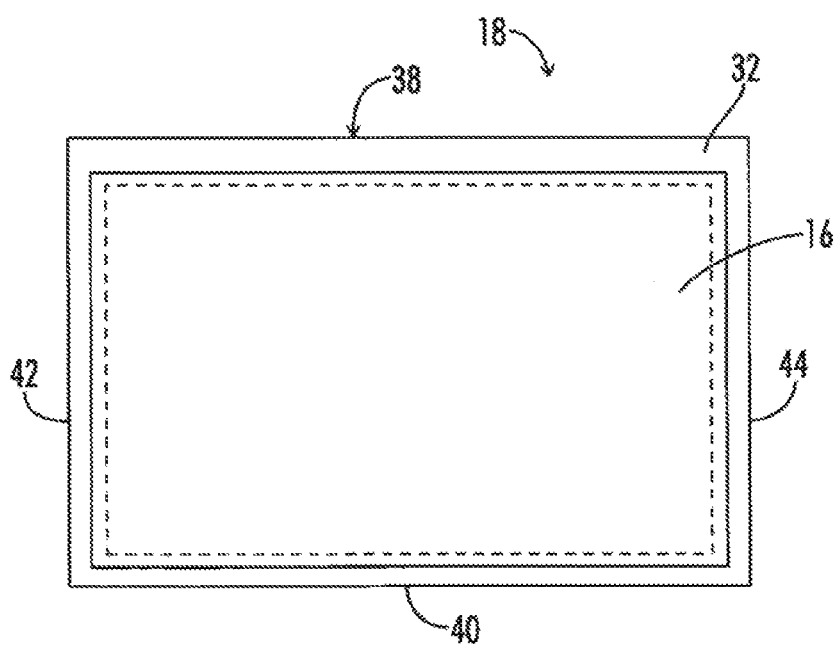
FIG. 13 is a back view similar to FIG. 12.

The image display panel 12 can include an image display side 13 on which the image 14 is displayed. The image display side 13 can be seen through the casing 11 of the image display device as best illustrated in FIG. 10.

Looking now at FIGS. 1-8, assembly of an embodiment of an image display device 10 made in accordance with the current invention can be described as follows. An adhesive 32, for example acrylic adhesive tape, can be attached to the flange 30 opposite the lip 28. The width of the adhesive 32 is preferably less than the width of the flange 30 to allow room for attachment of the heat dispersion material 16 to the flange 30 of the framework 18. A second adhesive 33, such as a pressure sensitive adhesive, could be used on the inner part of the flange 30 to attach the heat dispersion material 16 to the flange 30 of the framework 18. Alternately, the adhesive 32 can substantially span the width of the flange 30, wherein the heat dispersion material 16 is attached to the framework 18 by the adhesive 32.

In a preferred embodiment the thickness of the adhesive 32 is substantially the same as the thickness of the heat dispersion material 16. This further facilitates the positioning of the heat dispersing material 16 proximate to the image display panel 12 and facilitates a proper attachment of the framework 18 to the image display panel 12. Alternately, mechanical fixtures could be used to attach the framework 18, heat dispersion material 16, and the display panel 12.

The heat dispersion material 16 could also include an adhesive (not shown) on the surface facing the image display panel 12. This adhesive, for example a pressure sensitive adhesive, can facilitate good thermal contact between the image display panel 12 and the heat dispersion material 16 to enhance the heat dissipation within the image display device 10.

The combination of the framework 18 and heat dispersion material 16 could be pressure sealed to the image display panel 12. This type of seal facilitates a proper placement of the heat dispersion material 16 to the image display panel 12 to disperse the heat generated by the image display panel 12. Additionally this type of seal can aid the framework 18 in properly supporting the image display panel 12. This pressure can be applied in various ways, such as a compliant pad or a pressurized air system during assembly. Alternately, the heat dispersion material 16 could be individually engaged to the image display panel 12 with the framework 18 subsequently engaged to the assembled combination of the image display panel 12 and the heat dispersion material 16.

Next the printed circuit boards 20 could be applied to the framework 18, or heat dispersion material 16. The printed circuit boards 20 could be attached to standoffs (not shown) as known in the art and positioned to properly control the display of the image 14 on the image display side 13 of the image display panel 12. The printed circuit boards 20 could also be positioned on the lip 28 or flange 30 of the framework 18.

Additionally, cross supports 34 could be attached to the framework 18. These cross supports 34 could be used to strengthen and stabilize the framework 18 and overall image display device 10. The engagement between the cross supports 34 and the framework 18 could include mechanical fasteners such as screws, bolts, rivets, clips, and the like, as known in the art.

Multiple cross supports 34 could be used to add further rigidity to the framework 18 and image display device 10. These cross supports 34 could include additional traversing members 36 used to add further rigidity to the framework 18. The cross supports 34 preferably span the framework 18 and can engage the lip 28 or flange 30. The cross supports 34 and traversing members 36 can be comprised of, individually or in combination, steel, aluminum, and plastic. The cross supports 34 could be used to engage the casing 11 and secure the casing 11 as part of the image display device 10. In an alternate embodiment a plurality of second printed circuit boards 21 could be attached to the cross supports 34 or traversing members 36 to provide further controls for the image display device 10.

The printed circuit boards 20 and 21 can be spaced from the heat dispersion material 16 to allow more air movement between the printed circuit boards 20 and 21 and the heat dispersion material 16 to facilitate effective heat removal from the image display device 10.

Alternately, the framework 18 can be described as an open framework 18. The open framework 18 includes an aperture 26 within its perimeter to facilitate heat transfer within the image display device 10. The framework 18 can also be alternately described as a perimeter framework 18 wherein the perimeter framework 18 includes a top 38, bottom 40, first side 42, and second side 44. The top 36, bottom 40, first side 42, and second side 44 can define the aperture 26 and can be shaped to form the flange 30 of the perimeter framework 18.

The framework 18 could be manufactured as a single extruded piece and bent, or folded, into shape. Alternately, the framework 18 could be manufactured in multiple pieces and mechanically assembled, such as by rivets, welds, or the like, thereby reducing the need to stamp the framework 18 from a single sheet of material.

Thus, by the practice of the present invention, a display panel, such as a plasma display panel, a liquid crystal display, and the like, can be constructed with a reduced need for a support member, indeed, without the need for a support member at all, resulting in substantial savings in both weight and cost for the display panel.

All cited patents and publications referred to in this application are incorporated by reference.

The invention thus being described, it will obvious that it may be varied in many ways. Such variations are not to be regarded as a departure from the spirit and scope of the present invention and all such modifications as would be obvious to one skilled in the art are intended to be included in the scope of the following claims.

What is claimed is:

1. An image display device having improved temperature uniformity, the display device comprising:
    a) an image display panel; and
    b) a frame system comprising
        1) a metal support member positioned proximate to the image display panel;
        2) a heat dispersion material positioned proximate to the metal support member and opposite the image display panel such that the metal support member is positioned between the heat dispersion material and the image display panel; and
        3) a framework positioned proximate to the metal support member and/or positioned proximate to the heat dispersion material and opposite the metal support member such that the heat dispersion material is between the metal support member and the framework;
    wherein the image display panel comprises a plurality of heat sources;
    wherein the heat dispersion material comprises at least one sheet of compressed particles of exfoliated graphite having an in-plane thermal conductivity of at least about 250 W/m·K and a thermal anisotropic ratio of no less than about 10;
    wherein the frame system exhibits a support factor of less than about 150 mm·W/m·K, wherein the support factor is determined by multiplying the thickness of the metal support member by its in-plane thermal conductivity; and
    wherein the image display device exhibits improved temperature uniformity as compared to an image display device having a frame system which exhibits a support factor of less than 150 mm·W/m·K but does not include a heat dispersion material having an in-plane thermal conductivity of at least 250 W/m·K and a thermal anisotropic ratio of no less than 10 proximate to the metal support member.

2. The image display device of claim 1, wherein the heat dispersion material comprises at least one sheet of compressed particles of exfoliated graphite having an in-plane thermal conductivity of at least 250 W/m·K and a thermal anisotropic ratio of no less than 10; and wherein the frame system exhibits a support factor of less than 150 mm·W/m·K.

3. The image display device of claim 2, wherein the metal support member comprises a steel sheet.

4. The image display device of claim 2, wherein the framework comprises a height and width, wherein the heat dispersion material spans one or both of the height and width of the framework.

5. The image display device of claim 2, wherein the frame system further comprises one or more cross supports spanning the framework.

6. The image display device of claim 2, wherein the heat dispersion material is in operative thermal contact with the plurality of heat sources of the image display panel.

7. The image display device of claim 2, wherein the display device further comprises:
    c) a plurality of electronic components engaging one or both of the metal support member and the framework.

8. The image display device of claim 7, wherein the heat dispersion material is in operative thermal contact with the plurality of electronic components.

9. A frame system for an image display device comprising an image display panel, wherein the image display panel comprises a plurality of heat sources, the frame system comprising:
    a) a metal support member positioned proximate to the image display panel;
    b) a heat dispersion material positioned proximate to the metal support member and opposite the image display panel such that the metal support member is positioned between the heat dispersion material and the image display panel; and
    c) a framework positioned proximate to the metal support member and/or positioned proximate to the heat dispersion material and opposite the metal support member such that the heat dispersion material is between the metal support member and the framework;
    wherein the heat dispersion material comprises at least one sheet of compressed particles of exfoliated graphite having an in-plane thermal conductivity of at least about 250 W/m·K and a thermal anisotropic ratio of no less than about 10;
    wherein the frame system exhibits a support factor of less than about 150 mm·W/m·K, wherein the support factor is determined by multiplying the thickness of the metal support member by its in-plane thermal conductivity; and
    wherein the image display device exhibits improved temperature uniformity as compared to an image display device having a frame system which exhibits a support factor of less than 150 mm·W/m·K but does not include a heat dispersion material having an in-plane thermal conductivity of at least 250 W/m·K and a thermal anisotropic ratio of no less than 10 proximate to the metal support member.

10. The frame system of claim 9, wherein the heat dispersion material comprises at least one sheet of compressed particles of exfoliated graphite having an in-plane thermal conductivity of at least 250 W/m·K and a thermal anisotropic ratio of no less than 10; and wherein the frame system exhibits a support factor of less than 150 mm·W/m·K.

11. The frame system of claim 10, wherein the metal support member comprises a steel sheet.

12. The frame system of claim 10, wherein the framework comprises a height and width, wherein the heat dispersion material spans one or both of the height and width of the framework.

13. The frame system of claim 10, wherein the frame system further comprises one or more cross supports spanning the framework.

14. The frame system of claim 10, wherein the heat dispersion material is in operative thermal contact with the plurality of heat sources of the image display panel.

15. The frame system of claim 10, wherein the image display device further comprises a plurality of electronic components, wherein the plurality of electronic components engage one or both of the metal support member and the framework.

16. The frame system of claim 15, wherein the heat dispersion material is in operative thermal contact with the plurality of electronic components.

\* \* \* \* \*